United States Patent [19]

Fick

[11] Patent Number: 4,842,911
[45] Date of Patent: Jun. 27, 1989

[54] INTERFACING FOR HEAT SINKS

[75] Inventor: Herbert J. Fick, Northfield, Minn.

[73] Assignee: The Bergquist Company, Minneapolis, Minn.

[21] Appl. No.: 222,069

[22] Filed: Jul. 8, 1988

Related U.S. Application Data

[60] Continuation of Ser. No. 820,217, Jan. 21, 1986, abandoned, which is a division of Ser. No. 529,033, Sep. 2, 1983, Pat. No. 4,602,678.

[51] Int. Cl.$^4$ .......................... B32B 7/00; B32B 27/06
[52] U.S. Cl. ...................................... 428/40; 428/213; 428/217; 428/244; 428/269; 428/328; 428/329; 428/352; 428/447
[58] Field of Search ................. 428/40, 213, 217, 242, 428/244, 269, 328, 329, 352, 447

[56] References Cited

U.S. PATENT DOCUMENTS

| | | | |
|---|---|---|---|
| 3,032,438 | 5/1962 | Gaynes et al. | 428/242 |
| 3,235,772 | 2/1966 | Gurin | 428/242 |
| 3,312,574 | 4/1967 | Laur | 428/447 |
| 3,398,043 | 8/1968 | Youngs | 428/447 |
| 4,233,356 | 11/1980 | Jacobs | 428/247 |
| 4,342,803 | 8/1982 | Stengle, Jr. | 428/244 |

Primary Examiner—William J. Van Balen
Attorney, Agent, or Firm—Orrin M. Haugen

[57] ABSTRACT

Withdrawal and dissipation of heat from an electronic solid-state device by an associated heat-sink structure are promoted by a relatively thin broad-area dielectric interfacing composed of dual filled layers of compliant silicone rubber in sandwiching relation to a porous glass-cloth carrier, one of the layers being pre-vulcanized and the other being subsequently cured and bonded in place once the composite interfacing has been applied to heat-sink surfaces adapted for abutment with the device for the intended heat transfer. The soft rubber interfacing offers good dielectric and insulating and voltage-breakdown characteristics even when well loaded with thermally-conductive oxides, and intimate voidless surface contacts and high-quality thermal matching are fostered both along abutting compliant surfaces of the pre-cured portion of the interfacing and along fully bonded surfaces of the portion cured in situ. Processing which makes such interfacing eminently practical and particularly advantageous to the user includes initial application of filled uncured rubber to one side of the sheet of the porous carrier, followed by its vulcanization and then by application of a further uncured amount to the opposite side of the carrier, with a protective peel-off plastic covering being used to facilitate handling and release-cutting of desired smaller wafer configurations from the large-area composite; uncured sides of the smaller peeled wafers are than mated with appropriate parts of heat sinks and cured, thereby producing heat sinks integrated with securely-bonded thermally-matching dielectric interfacing in readiness for unions with devices from which heat must be dissipated efficiently.

7 Claims, 1 Drawing Sheet

INTERFACING FOR HEAT SINKS

This is a continuation of divisional application Ser. No. 820,217, filed Jan. 21, 1986, abandoned, which is a divisional of parent U.S. application Ser. No. 529,033, filed Sept. 2, 1983, now U.S. Pat. No. 4,602,678, issued July 29, 1986.

BACKGROUND OF THE INVENTION

The present invention related to improvements in thermal interfacing of electronic devices and the like in relation to heat sinks with which they are mounted for moderation of their operating temperatures and enhancement of their power-handling ratings, and, in one particular aspect, to novel and improved heat sinks prepared with elastomeric thermal-matching coatings cured in place in intimately-bonded relationship and exhibiting exposed compliant pre-cured dry surfaces for essentially voidless interfacing with devices from which heat must be extracted and dissipated efficiently.

As is well known in the art, applications of miniature semiconductor devices and microcircuit modules, and the like, may be severely limited in respect of the self-generated heat which they can successfully expel and prevent from building up as it is sought to have them operate at higher and higher powers. In many instances, costs and complexities and the environments of use prevent forced-fluid cooling systems from being used, and resort is then commonly had to more simple and economical expedients involving the attachment of simpler finned metal extrusions or stampings which serve to conduct and radiate heat away from thermally-vulnerable regions. In implementing efficient heat-sinking of either type, it is of special importance that the thermal impedance between a semiconductor or microcircuit unit and its associated heat-sink structure be kept to a minimum and that it be of uniformity which will prevent build-up of localized hot spots. Those characteristics are not likely to be achieved reliably and predictably, and to an optimum extent, by simply abutting some part of the heat-generating unit with complementary surfaces of its heat sink, largely because, despite superficial appearances, the interfacing between the respective mating surfaces will generally exhibit only a surprisingly small percentage of areas in actual sound contact. Such contact failure, with attendant poor transmission of heat, is caused in part by relatively gross surface imperfections, whose effects can be offset somewhat by subjecting the complementary surfaces to precise metal-forming or machining operations, and, in part, by essentially microscopic irregularities which will remain at the interfaces even if the cooperating parts are fashioned and finished with great care. When it becomes necessary to provide electrical insulation and high-quality dielectric characteristics between the mated parts, the heat-conduction problems are greatly compounded.

Among the prior practices which have been employed in efforts to improve the heat flow from semiconductor or like devices to their heat sinks is that of spreading amorphous oil or grease, such as silicone, between the joined surfaces. The messy aspects of use of such a filler, as well as the uses of insulating mica and varnish insulating layers, are referred to in U.S. Pat. Nos. 3,229,757 and 3,391,242. Thermal grease and/or powdered metal, contained by a film, has also been proposed to augment heat transfer, in U.S. Pat. No. 4,092,697, although the fabrication and handling of such small "pillows" obviously involves special problems as well. Cooling fins have been secured by way of epoxy cement loaded with powdered metal (U.S. Pat. No. 3,261,396), and large-area epoxy films have been said to insulate while yet transferring large quantities of heat (U.S. Pat. No. 3,611,046. In U.S. Pat. No. Re. 25,184, electrically non-conducting plastic coating material is filled with molybdenum disulphide to promote heat conduction, and, where electrical insulation is not essential, a dimpled malleable metal wafer may be interposed to increase transfer of heat (U.S. Pat. No. 4,151,547). Paper or cardboard carriers or pads have been proposed for convenient handling of a heat-transferring medium used to interface a semiconductor device and its mounting (for paraffin wax, in Canadian Pat. No. 600,823, issued June 28, 1960), and normally-solid waxy material which may be rubbed on to fill minute voids and thereby improve heat transfer has been described in U.S. Pat. No. 4,299,715. Pads which release a supply of silicone grease when compressed have been proposed as a means for reducing difficulties in the handling of silicone grease (U.S. Pat. No. 3,391,242), and beryllium oxide cement including a silicon rubber or other rubber-like plastic binder has been proposed as a means for securing devices to a heat-dissipating chassis while maintaining electrical insulation (U.S. Pat. No. 3,187,226). Dry silicone-rubber wafers have likewise been used to provide cushioned insulating mountings.

SUMMARY OF THE INVENTION

The present invention is aimed at improving the interfacing of electronic devices with their associated heat sinks, and, in particular, at promoting convenience, simplicity and economy in the fashioning of such combinations while at the same time making possible reliably high-quality thermal couplings which will aid in the efficient cooling of such devices. In one preferred embodiment, selected surfaces of a metal heat sink, opposite which are to be disposed the complementary surfaces of an electronic semiconductor device from which heat is to be withdrawn, are overlaid by a thin composite interface coating consisting primarily of silicone rubber bonded securely to those surfaces by a curing in the nature of vulcanizing. The exposed outer surfaces of that composite coating, against which the semiconductor device is to be abutted, are exhibited by a pre-cured thin relatively soft and compliant layer of silicone rubber which had undergone an initial vulcanizing treatment after being deposited upon a relatively loosely woven glass-cloth carrier, the other side of that carrier then having been coated thinly with the silicone-rubber composition whose curing in place on the heat sink produced the desired intimate bonding. The curing-and-bonding operation is conducted under pressure, such as that of mechanical clamping or weighting, to heighten the likelihood that even minute interstitial spaces between the heat sink and the uncured layer, and between the uncured layer and pre-cured layer, will remain free of any troublesome voids which could otherwise interfere with optimum transmission of heat through the interface coating. For like reasons, the pre-cured layer is made compliant enough so that it will assume essentially a fully-contiguous relationship to heat-release surfaces of a semiconductor device when it is mechanically fastened to the heat sink. The silicone rubber layers are preferably filled or loaded with small particles of oxides which enhance heat-transmission properties of the interfacing and that need not interfere with dielectric and electrical-insulating qualities of the assembly. Once the bonding-in-place has been effected, the heat sink with integrated interfacing is a wholly dry and unitary structure which may be handled conveniently and easily fitted in well-matched relation to an electronic device without requiring bothersome uses of grease, paste or separate wafer elements.

Accordingly, it is one of the objects of the present invention to provide novel and improved heat-sink arrangements, and the like, in which transfer of heat between confronting surfaces is promoted by a composite integrated and substantially homogeneous interfacing one stratum of which is intimately pre-bonded both to one of the surfaces and to a pre-cured but compliant companion stratum adapted to form a substantially voidless contiguous abutment with the other of the confronting surfaces.

A further object is to provide for the unique and advantageous fabrication of heat sinks incorporating dry thermal-matching coatings by which electronic devices may be interfaced with them for cooling, such coatings being produced from silicone-rubber layers in separate curing stages which allow for intimate bonding of parts and convenient handling of the materials and the coated heat sinks.

BRIEF DESCRIPTION OF THE DRAWINGS

Although the aspects of this invention which are considered to be novel are set forth in the appended claims, further details as to preferred practices and as to further objects and features thereof may be most readily comprehended through reference to the following detailed description when taken in connection with the accompanying drawings, wherein

DETAILED DESCRIPTION OF THE PREFERRED EMBODIMENTS

Figure 1:
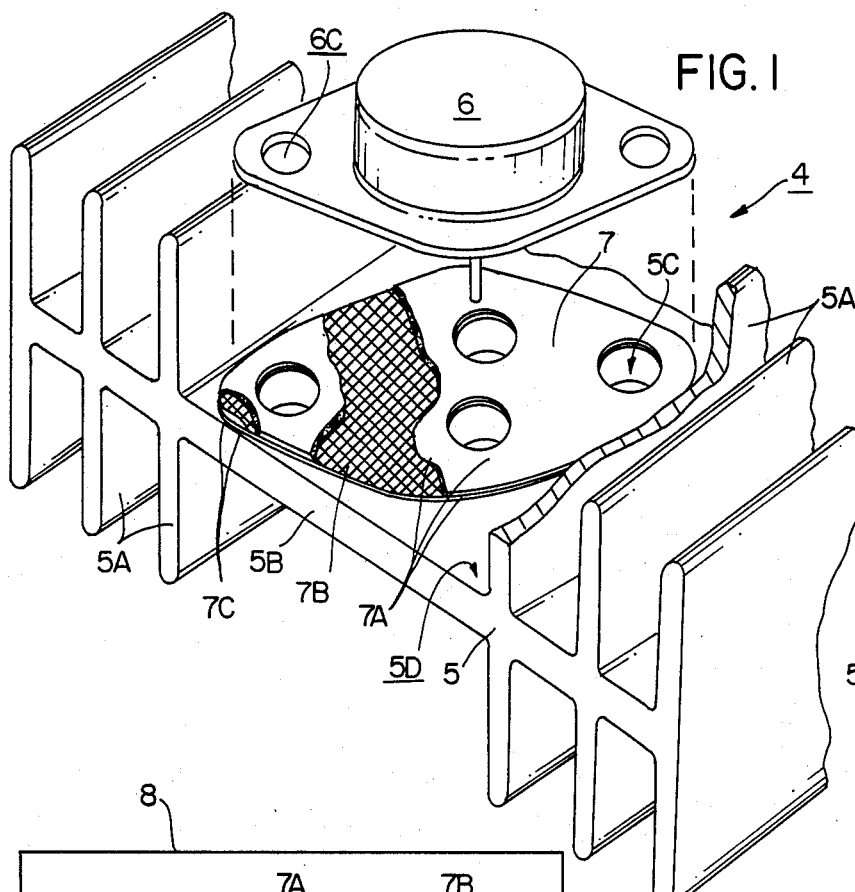
FIG. 1 is a pictorial representation, with portions broken away and sectioned, of an improved heat-sink arrangement having an integral interfacing for cooperation with an electronic semiconductor device, the latter being shown in an "exploded" relation to expose detail of the interfacing.

Having reference to the drawings, wherein like reference characters designate identical or corresponding parts throughout the different views, and more particularly to FIG. 1 thereof, one embodiment of an improved heat-sinking arrangement, 4, is shown to involve an extruded metal heat sink 5 having multiple ribs or fins 5A and a planar base portion 5B to which an electronic semiconductor package 6 is to be affixed by way of fasteners, such as nuts and bolts (not shown), which are accommodated by bolt holes such as 5C and 6C, respectively. Package or device 6 will be recognized as having an overall contouring like that of a commonly-known type TO-3 power transistor, but, like heat sink 5, is illustrative only, other semiconductor devices and circuit modules and heat-sink configurations also being served to advantage by improved interfacings which exploit key features of the thin and compliant interface coating 7. The latter interfacing has the general outline of the semiconductor device with which it is intended to cooperate, in this case the outline of a TO-3 package, and its bottom surface is securely bonded into an essentially integral unified relationship with the substantially flat upper surfacing of heat-sink base portion 5B. Interfacing 7 is a dry and significantly compliant coating which has an essentially homogeneous character, although it is in fact a composite of two principal integrated layers of material such as an oxide-loaded silicone rubber. Total thickness of the interfacing may typically be merely about seven thousandths of an inch, the upper soft layer 7A being pre-cured in unified relation to a glass-fabric carrier, 7B, and the lower layer 7C being cured "in situ" on the upper surface 5D of base portion 5B after having been applied uncured over the uncoated side of the carrier. The latter curing is best effected at elevated temperature while a suitable die or pad presses against the upper layer and causes the uncured material to displace all air and fill all voids such as minute interstices and any larger spaces appearing between the upper base-portion surface 5D and the underside of the carrier 7B. Once the silicone-rubber layer 7C has been so "vulcanized", it establishes a permanent and exceedingly-strong bond between the heat sink 5 and the previously-vulcanized upper layer 7A, and the wholly dry combination is then ready for the user merely to bolt on a device 6 which is to be cooled; a good-quality interfacing is virtually assured because of the aforesaid voidless bonding and because the compliant layer portion 7A of the interfacing allows itself to be molded into contiguous abutting relation to the confronting surfaces of the bolted-on device.

Figure 2:
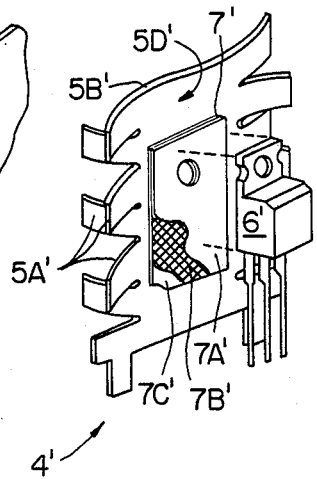
FIG. 2 pictorially illustrates another form of improved heat sink intended for cooperation with a different type of electronic semiconductor device and having an integral interfacing thereon, the latter being partly in section and the device being in an "exploded" relation.

The arrangement 4' in FIG. 2 is similar, and therefore corresponding elements and features in that illustration are designated by the same reference characters bearing distinguishing single-prime accents, as an aid to simplified description. Device 6' will be recognized as being of the so-called "plastic power" type, in which a small perforated metal mounting and heat-releasing plate is unified with a plastic-encapsulated semiconductor unit. Its perforated plate allows for bolting (not shown) against the flat central base portion 5B' of the stamped sheet-metal heat sink 5' having rows of twisted cooling fins 5A'. The portion of surface 5D' against which the device 6' is to be abutted for heat transfer is coated with a dry compliant interfacing 7' resulting from a pre-curing or vulcanizing of a first thin layer of filled silicone rubber, 7A', on a carrier, 7B', followed by application of a second filled silicone-rubber layer, 7C', to the opposite side of the carrier and a curing of that layer under compression in place on the surface 5D' so that it makes essentially voidless permanent bonds both with the heat sink and the pre-cured layer. A user's assembly of the device to the heat sink requires mere bolting of the parts together, at which time the dry compliant interfacing yields and molds itself into a substantially full contiguous abutment with confronting surfaces of the device and thereby promotes high-quality thermal matching and opportunity for good conduction of heat to the heat-dissipating sink 5'.

Silicone rubber is per se well known as a compliant insulating material having outstanding dielectric properties, and, although separate thin "wafers" of such material have been used to mount electronic devices in relation to their heat sinks, it is better to avoid stocking and handling of separate insulating pieces and to have a sound intimate bond at a site where otherwise another abutting juncture would result in less favorable heat-transfer characteristics. Materials which are merely good adhesives, or which will adhere well and then cure quite hard, will not necessarily best serve the needs of heat-sink interfacing which must withstand harsh environmental conditions such as extreme temperatures, shock and vibration while maintaining voidless contacts and compliance and structural integrity. If it were not for need to tolerate such rigorous conditions, and for convenience and economy of fabrication, pads or layers of many materials might suffice simply to replace the troublesome "air barriers" which are so largely responsible for poor heat transmission between a device and its heat sink. Silicone rubber in the uncured or "unvulcanized" state does not stick well to most common materials, and it is not until it is cured that it may be relied upon to make a permanent voidless and non-slipping bond with a heat sink. Even in thin layers, such uncured material should not be relied upon either to remain in place or to hold a protective film until an assembler is ready to strip it and fasten a semiconductor device with the heat sink. Curing of such a simple layer "in situ" would require that it somehow be kept intact and clean, and that the semiconductor device with which it is joined then be exposed to the same "vulcanizing" conditions over a time which would entail costly delay and waste for the user. Pre-cured wafers must be made relatively thick or relatively strongly reinforced, because thin pieces of silicone rubber tend to be mechanically weak and may stretch and pull unevenly when clamped between a device and its heat sink.

Figure 3:
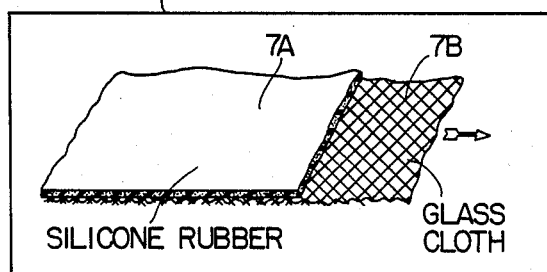
FIG. 3 is block diagram representing the processing which develops an improved interfacing for a heat sink, together with partly cross-sectioned illustrations of interfacing and heat-sink features at various stages of the processing.
Figure 3:
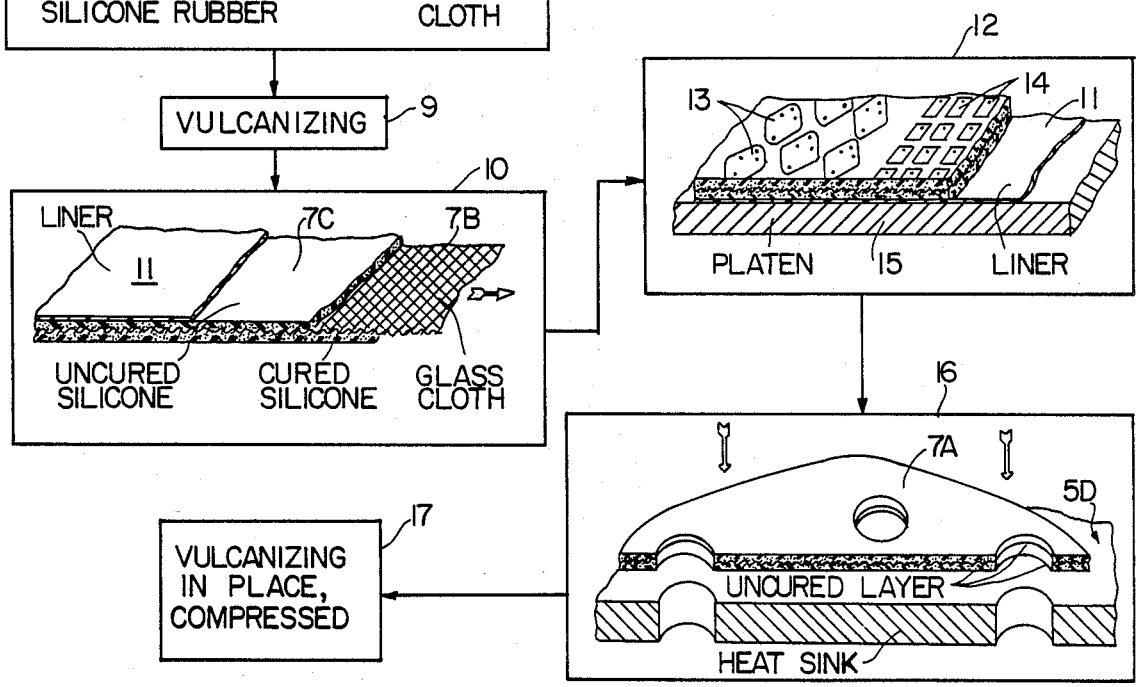

It is largely for such reasons that the interfacings 7 and 7' in FIGS. 1 and 2 are instead of a distinctive composite character involving a pre-cured portion in cooperation with a portion cured in place upon a heat sink. The processing block-diagramming in FIG. 3 aids in understanding the preferred techniques and sequencing of operations for producing such interfacing, and, in an initial stage, characterized within block 8, the thin layer 7A of filled silicone resins 7A is applied to the porous glass-fiber carrier 7B in an uncured state. Typically, the gossamer-like carrier material may be over forty inches wide and of a very small thickness such as 0.002–0.003 inch, and its porous weave or mesh may be of treated fibers whose weight amounts to but about 2.5 oz. per square yard. The uncured silicone material preferably is filled or loaded with enough of finely-divided heat-conducting particles to cause it to exhibit significantly better thermal conductivity than it would otherwise have unaided; metal oxides such as alumina adhere well to the silicone rubber and are particularly well suited to such filling, but other and electrically-conductive fillers such as finely-divided nickel or graphite particles or filaments may be used in some instances. A controlled uniform thickness of applied layer 7A, with intended good penetration of its carrier 7B, is achieved in a known form of calendering operation, although other application techniques may be employed where feasible with promise of comparably advantageous results. The carrier may be temporarily backed by a non-porous film or the like which is capable of being stripped away later, so that it will not be present in the completed interfacing where it could interfere with heat-transmission characteristics. A carrier consisting essentially of glass fibers is preferred for support and reinforcement of the silicone rubber layer while it is initially uncured, as well as later in the processing when undesirable stretching or other deformations might occur, particularly during handling by an assembler and when an electronic device is being bolted or otherwise fastened to a coated heat sink. In fact, such glass fibers are not particularly welcome in the interfacing, insofar as the thermal characteristics are concerned, because they offer poorer heat-conduction than do the filled silicone rubber layers; however, their use greatly facilitates the manufacture and promotes structural integrity of the interfacing, and, when their weave or matting is porous enough the filled silicone material penetrates adequately to prevent a substantial thermal barrier from being created. Silicone resin does not normally adhere well to glass fibers and fabric, and therefore a carrier for such material is best treated beforehand to improve its wettability by the resin. Mills which supply glass cloth commercially can supply it with such wettability enhanced by a process such as one which involves application of common starch, followed by a carmelizing or baking and heat-cleaning to burn away the starch and oils and other interfering contaminants. Alternatively, the glass-fiber carrier may be treated with silicone material to improve wettability by the resin. Other carrier materials may be used instead, such as Dacron or cotton or other plastics fibers or perforated films which will have the needed mechanical characteristics while not unduly interfering with thermal conductivity or producing unwanted electrical properties (such as poor dielectric qualities or susceptibility to voltage breakdowns). Anodized aluminum film will serve some such carrier purposes, for example. Thinness of layer 7A is generally important (such as about 2½–3 mils), and the structural weakness of such a thin layer, if it is not reinforced, can be a problem; however, to the extent that such weakness can be tolerated or avoided, or if only a small amount of reinforcement is involved, then, in lieu of using the carrier 7B, the silicone material 7A may be applied directly to a temporary backer such as a film of Mylar which offers good "release" qualities when it must later be stripped away to allow the second layer 7C to be applied.

Once the thin and uniform first layer 7A has been developed in an uncured condition, it must be converted into a structurally more sound and "dry" rubbery or compliant conditions which allows it to be handled conveniently and, ultimately, to be abutted with and adjust itself into a fully contiguous contact with an electronic device. That conversion is effected in a "curing" or "vulcanizing" type step, characterized by block 9, and which is in accordance with known practices for such silicon-rubber material. A curing involving a peroxide curing agent may take five to thirty minutes or so, and a suitable elevated temperature may be created by hot air. In another practice, there may be an air-dry type of curing, or a solvent-type curing involving materials such as toluene, xylene, mineral spirits or naphtha. Conventional curing involving sulphur unfortunately can invite corrosion problems.

In the next processing state, 10, the now-cured thin layer 7A, united soundly with its carrier 7B, is coated with the second layer, 7C, which is uncured and preferably of the very same filled material, and thus fully compatible. Calendering or other techniques for applying the second uncured layer, to the other side of the carrier 7B, are better withstood, mechanically, because of the structural integrity possessed by the pre-cured and reinforced first layer. The newly-applied uncured layer, of the same silicone-rubber material as the first, adheres well to the cured silicone-rubber material which has penetrated through the carrier. However, the layer of uncured material, even though very thin (also merely about 2½–3 mils), and even though not especially prone to stick to many other substances, is nevertheless in need of a liner and covering, 11, which will both protect it against contamination or physical injury and severe as a support when the composite of materials is cut into shaped pieces best suited to bonding to various forms and sizes of heat sinks. That liner, 11, may be introduced in the calendering operations, or later, and is selected from among materials which will "part" or "release" in an orderly manner from the silicone resin liner material without leaving uncured layer 7C uneven or otherwise in a disorderly condition in relation to the thin and uniform-thickness state in which it should be when eventually adhered to a heat sink. High-density polyethylene or polypropylene films or sheets will serve such purposes well, for example. In a succeeding stage of processing, 12, the thus-lined composite of dual layers of the same cured and uncured silicone-rubber material are die-cut into shapes, such as the shapes of elements 13 and 14, which correspond to shapes of the interfacings 7A and 7A' (FIGS. 1 and 2). A platen 15 supports the composite while die-cutting takes place to separate the individual elements from the broader-area sheet and to create the peel-away elements 13 and 14 which may readily be lifted from the liner 11 and applied to a heat sink, after the fashion of stick-on labels. In a later stage of processing, 16, the liner 11 is stripped away and the shaped composite of cured and uncured layers of the filled-silicone rubber is deposited on the base surface 5D of a heat sink, uncured side down so that it may engage and be adhered to that surface to form the intended interfacing. Anodized surfaces of the heat sink will receive and bond well with silicone rubber, because it adheres effectively to oxides, but sticking and bonding can also be promoted by first applying a primer, such as a chromate primer in the form of chromic acid. A final stage of curing, of the uncured layer 7C, is required before the interfacing can be counted upon being bonded with integrity to the heat sink and caused to become a substantially homogeneous coating in which the first and second layers are fully integrated with one another. That curing, 17, may be effected in the manner of the "vulcanizing" described with reference to stage 9, involving like times and curing agents, except that the composite of cured and uncured layers is compressed, as by pressing a heated metal block over it, to insure that the uncured layer will make full contact and bond securely with the base surface 5D without leaving any voids. After that, the heat sink with its "dry" interfacing is ready for a manufacturer of electrical equipment to bolt it to a semiconductor device or the like which requires cooling.

Various general-purpose silicone resins well known to the trade may be used for the interfacing layers, such as a so-called "VMQ" vinyl methyl compound. Whether of silicone rubber or some specifically-different material or materials, the upper layer in particular should evidence certain qualities normally associated with elastomers, and, specifically, an elastic or compliant ability to yield and conform to mating surfaces of an associated electric device, and a flowable character in an uncured state which may be altered to the elastic or compliant character in a readily-cured state. The companion lower layer should adhere well to that upper layer and to a heat sink surface, and should transmit heat well. In some instances, the devices which are to be cooled may themselves be provided with such an interfacing, or it may be applied to chassis parts or circuit boards or other components not of conventional heat-sink form. Accordingly, it should be understood that the specific embodiments and practices shown and described herein have been presented by way of disclosure, rather than limitation, and that various modifications, combinations and substitutions may be effected by those skilled in the art without departure in spirit or scope from this invention in its broader aspects and as set forth in the appended claims.

What I claim as new and desire to secure by Letters Patent of the United States is:

1. An interfacing for effecting transfer of heat between an electrical device and a heat sink, comprising a substantially flat, thin and uniform-thickness composite of dual layers of material promoting conduction of heat, the material of each of said layers being curable for controlled conversion from an uncured substantially amorphous conditions to a dry and relatively firm state, one of said layers being cured or vulcanized silicone rubber filled with heat conducting particles so as to be durable under heat and pressure, and having an exposed surface which is compliant after conversion to the dry and relatively firm state, the other of said layers being silicone rubber in an uncured condition filled with heat conducting particles and adhering on one side to the under surface of said one of said layers opposite said exposed surface, and a strippable temporary liner covering the other side of said other of said layers, said strippable liner being removable to expose said other side for substantially voidless abutment with a receiving surface through which heat is to be conducted by said composite of layers, said other of said layers being curable under heat and pressure to form a permanent bond with both said receiving surface and said one of said layers, the surface of said permanent bond being in replication of said receiving surface.

2. An interfacing as set forth in claim 1 wherein said one of said layers is of a thickness of the order of 0.0025–0.003 inch.

3. An interfacing as set forth in claim 1 wherein said one of said layers incorporates a relatively thin carrier bonded therewith by the curing thereof along said under surface thereof, said carrier member promoting structural integrity of said one of said layers and of said composite of layers.

4. An interfacing as set forth in claim 2 wherein said carrier is porous and consists essentially of glass fibers.

5. An interfacing as set forth in claim 4 wherein said carrier is a woven fabric, and wherein said silicone rubber and minute particles in the material of said one of said layers penetrate said fabric at the site of said under surface.

6. An interfacing as set forth in claim 1 wherein said strippable liner is of material selected from high-density polyethylene and polypropylene.

7. An interfacing as set forth in claim 1 wherein said one of said layers incorporates a porous woven fabric consisting essentially of glass fibers and being bonded therewith along said undersurface, said composite of layers being of a thickness of the order of 0.007 inch.

* * * * *